United States Patent [19]
Hamuro et al.

[11] Patent Number: 5,160,066
[45] Date of Patent: Nov. 3, 1992

[54] APPARATUS FOR ALIGNING ELECTRONIC COMPONENT CHIPS

[75] Inventors: Mitsuro Hamuro; Toru Konishi, both of Kyoto, Japan

[73] Assignee: Murata Manufacturing Co., Ltd., Japan

[21] Appl. No.: 680,566

[22] Filed: Apr. 4, 1991

[51] Int. Cl.[5] .................................... B65H 9/14
[52] U.S. Cl. ................................. 221/172; 221/171
[58] Field of Search .......................... 221/171, 172

[56] References Cited

U.S. PATENT DOCUMENTS

| | | | |
|---|---|---|---|
| 4,401,234 | 8/1983 | Droira et al. | 221/92 |
| 4,979,640 | 12/1990 | Konishi et al. | 221/172 X |
| 4,993,588 | 2/1991 | Willberg et al. | 221/172 X |

FOREIGN PATENT DOCUMENTS

| | | |
|---|---|---|
| 0193255 | 9/1986 | European Pat. Off. |
| 0210662 | 2/1987 | European Pat. Off. |
| 0288277 | 10/1988 | European Pat. Off. |

*Primary Examiner*—Robert P. Olszewski
*Assistant Examiner*—Dean A. Reichard
*Attorney, Agent, or Firm*—Ostrolenk, Faber, Gerb & Soffen

[57] ABSTRACT

An apparatus for aligning electronic component chips, which is made of a resin material as a whole, comprises a chamber for storing a plurality of electronic component chips in random orientation, and an aligning passage for guiding the electronic component chips, which were stored in the chamber, to move while aligned along a prescribed direction. A wall surface defining the chamber and one defining the aligning passage are provided with conductivity, by formation of a metal-plated film or by other methods. Thus, static electricity, which may be caused by movement of the electronic component chips, is prevented, in order to attain smooth movement of the electronic component chips.

5 Claims, 4 Drawing Sheets

APPARATUS FOR ALIGNING ELECTRONIC COMPONENT CHIPS

BACKGROUND OF THE INVENTION

1. Field of the Invention

The present invention relates to an apparatus for aligning electronic component chips, which is adapted to bring a plurality of electronic component chips, including passive components, active components and other electrical components, as well as not only completed chip-type electronic components but also semifinished electronic component chips, into a state aligned along a prescribed direction.

2. Description of the background Art

The assignee (applicant) has proposed a cassette storing a plurality of electronic component chips, which is adapted to provide the plurality of electronic component chips to an apparatus for supplying such electronic component chips, in Japanese Patent Application No. 62-96925 (corresponding to EP 0288277A2 and U.S. Ser. No. 184,112) etc.

The aforementioned cassette storing electronic component chips basically comprises a plurality of electronic component chips, a case which is provided with a storage space for storing the electronic component chips in its interior and an outlet communicating with the storage space for discharging the electronic component chips, and an openable closure for closing the outlet. A manufacturer of electronic component chips can directly use such a cassette storing electronic component chips as a packaging mode which is applicable to transportation of electronic component chips, while a user of electronic component chips can directly mount the cassette on a chip mounting apparatus for supplying a plurality of electronic component chips to a work site for performing a chip mounting step.

FIG. 6 is a sectional view showing a chip mounting step, which is carried out using a cassette 1 (shown in phantom lines) storing electronic component chips. The cassette 1 is directly mounted on an aligning apparatus 2 for electronic component chips, which serves as a hopper of a chip mounting apparatus. In more concrete terms, an outlet of the cassette 1 is directed to an opening 3 of the aligning apparatus 2 so that the cassette 1 is fixed to the aligning apparatus 2. Then a closure of the cassette 1 is so opened as to supply a plurality of electronic component chips 4, which have been stored in a storage space of the cassette 1, into the aligning apparatus 2 from the outlet. The electronic component chips 4, which are illustrated in a simplified manner in FIG. 6, are in the form of rectangular parallelepipes, for example.

The aligning apparatus 2 is generally inclined at an angle 5, which is selected to be about 45°, for example. The electronic component chips 4 supplied in the aligning apparatus 2 successively pass through a larger chamber 6 and a smaller chamber 7, to finally reach an aligning passage 8. The aligning passage 8, which is illustrated with a plurality of electronic component chips 4 in FIG. 6, is adapted to guide such a plurality of electronic component chips 4 to move in a state aligned along a prescribed direction. In order to attain such a function, the sectional dimensions of the aligning passage 8 are selected to be in certain relation to those of each electronic component chip 4.

The electronic component chips 4 are already aligned with each other when the same are introduced into an inlet 9 for the aligning passage 8, and are discharged from an outlet 10 while maintaining such an aligned state. Since the electronic component chips 4 discharged from the outlet 10 are aligned along a prescribed direction, it is possible to efficiently carry out the chip mounting step by handling the electronic component chips 4 while they continuously hold their aligned state.

The sectional area of the internal space provided in the aligning apparatus 2 is abruptly reduced at the boundary between the smaller chamber 7 and the aligning passage 8. Therefore, the electronic component chips 4 tend to jam in a portion of the smaller chamber 7 around the inlet 9 for the aligning passage 8. In order to prevent such jamming, a blowing passage 11 is provided in the vicinity of the inlet 9 for the aligning passage 8, to introduce compressed air from the exterior in an intermittent manner, for example. The compressed air thus introduced through the blowing passage 11 blows on the electronic component chips 4 jamming around the inlet 9 for the aligning passage 8, to agitate the same.

A number of such aligning apparatus 2 for electronic component chips are mounted on a chip mounting apparatus, for example, to be exchangeable with other types of aligners at need.

In general, such an aligning apparatus 2 is made of a metal. This is because relatively high wear resistance is required for the aligning apparatus 2 since wall surfaces defining the larger and smaller chambers 6 and 7 are struck and rubbed by the electronic component chips 4. Particularly higher wear resistance is required for the smaller chamber 7, whose wall surface is strongly struck by the electronic component chips 4, which are blown about by the compressed air from the blowing passage 11. On the other hand, it is necessary to eliminate static electricity, which is caused by collisions of the electronic component chips 4, through conductivity of the metal material, thereby attaining smooth movement of the electronic component chips 4.

While the aligning apparatus 2 for electronic component chips is generally made of a metal for the aforementioned reasons, the following problems are caused in relation to the metal material:

First, complicated or costly working steps such as cutting work or die-casting are required, in order to prepare the aligning apparatus 2 from a metal. Consequently, not only the cost is increased, not only for the aligning apparatus 2 itself but also for carrying out the chip mounting step, which employs a large number of such aligning apparatuses 2.

Further, the weight of the aligning apparatus 2 is increased because of the metal material, leading to increase the burden in handling such an aligning apparatus 2.

SUMMARY OF THE INVENTION

Accordingly, an object of the present invention is to provide an aligning apparatus for electronic component chips, which can solve problems that may be caused when the aligning apparatus is made of a metal, as hereinabove described.

The present invention is directed to an apparatus for aligning electronic component chips, which comprises a chamber for storing a plurality of electronic component chips in random orientations, and an aligning passage communicating with the chamber for guiding the electronic component chips, being stored in the chamber, to move while aligned along a prescribed direction. In order to solve the aforementioned technical problems, the present invention has the following structure:

The inventive aligning apparatus for electronic component chips is made of a resin material as a whole. Further, at least one wall surface defining the chamber and one defining the aligning passage are provided with conductivity.

Such conductivity may be provided by a metal-plated film which is formed on the surface of the resin material. Alternatively, a resin material which is filled with a conductive filler may be employed, in order to provide the aforementioned conductivity. In the latter case, at least the wall surface defining the chamber and that defining the aligning passage may be coated with an antistatic agent, in order to attain sufficient conductivity.

A wall surface of the chamber defining a portion, which is close to an inlet for the aligning passage, may be provided by a metal block at need, and the resin material may be molded with the metal block inserted therein.

According to the present invention, the aligning apparatus for electronic component chips is made of a resin material as a whole, whereby the weight of such an aligning apparatus for electronic component chips can be reduced. Thus, it is easy to handle the aligning apparatus for electronic component chips. When a large number of such aligning apparatuses for electronic component chips are mounted on a chip mounting apparatus for carrying out a chip mounting step, the aligning apparatuses for electronic component chips are successively brought into a position corresponding to a certain pickup position for the electronic component chips in accordance with a prescribed program, in order to supply the electronic component chips from the aligning apparatus to the pickup position. When the aligning apparatuses for electronic component chips are reduced in weight, it is possible to increase their speed of movement, thereby enabling increase in speed of the chip mounting step.

When the aligning apparatus for electronic component chips is made of a resin material, it is possible to manufacture the aligning apparatus by a molding technique such as injection molding, for example, whereby the cost therefor can be reduced.

Further, it is also possible to reduce the manufacturing cost, due to replacement of the metal material by the resin material. In addition, such aligning apparatus for electronic component chips can be mass-produced by application of a molding technique such as injection molding.

In the inventive aligning apparatus for electronic component chips, at least the wall surface defining the chamber and that defining the aligning passage are provided with conductivity, whereby it is possible to prevent static electricity caused by movement of the electronic component chips. Thus, the electronic component chips are prevented from adhesion to any wall surface. Thus, it is possible to attain smooth movement of the electronic component chips in the aligning apparatus.

When the aforementioned conductivity is provided by a metal-plated film, it is possible to improve wear resistance and slipperiness of the wall surfaces which are brought into contact with the electronic component chips. Also when a resin material filled with a conductive filler is employed in place of the metal-plated film, it is possible to sufficiently provide the aforementioned wear resistance and slipperiness by selecting the resin material so that smoothness of the resin surface is increased.

When a metal block is employed for providing the wall surface of the chamber defining a portion close to the inlet for the aligning passage, the metal block, which is superior in reliability to a metal-plated film, for example, is consequently adapted to form a portion exposed to particularly strong movement of the electronic component chips with a strong requirement for smooth movement of the electronic component chips. Thus, it is possible to provide an aligning apparatus for electronic component chips, which has higher reliability in wear resistance and slipperiness. When such a metal block is employed, the resin material is molded with the metal block inserted therein, whereby it is possible to manufacture the aligning apparatus for electronic component chips to simultaneously include the metal block, while hardly reducing efficiency in the step of molding the resin material.

The inventive aligning apparatus for electronic component chips can be mass-produced at a low cost as described above, and hence no significant problem is caused in relation to the cost even if worn aligning apparatus must be exchanged.

These and other objects, features, aspects and advantages of the present invention will become more apparent from the following description of the present invention when taken in conjunction with the accompanying drawings.

DESCRIPTION OF THE PREFERRED EMBODIMENTS

Figure 1:
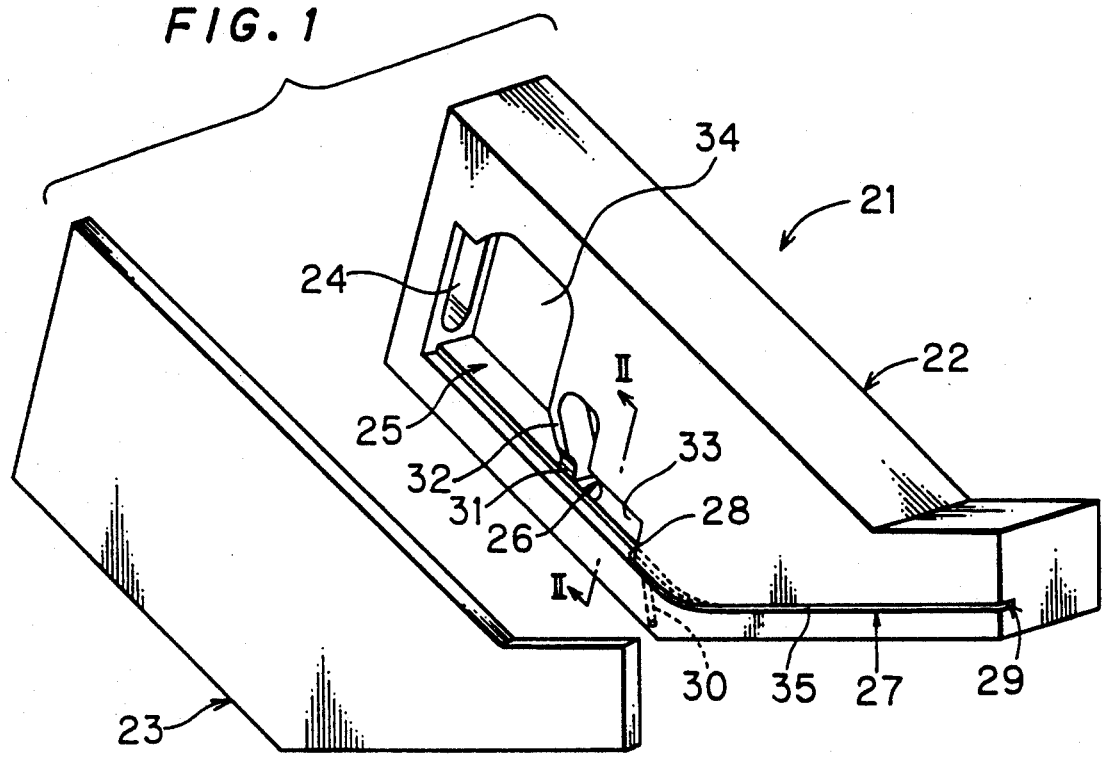
FIG. 1 is a perspective view of an aligning apparatus 21 for electronic component chips according to an embodiment of the present invention, illustrating a body 22 and a side plate 23 in a separated state.
Figure 2:
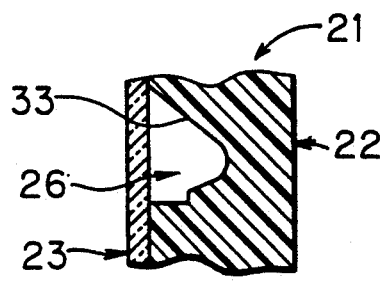
FIG. 2 is a sectional view taken along the line II—II in FIG. 1.

FIG. 1 is a perspective view showing an aligning apparatus 21 for electronic component chips according to an embodiment of the present invention. Referring to FIG. 1, the aligning apparatus 21 is separated into a body 22 and a side plate 23. FIG. 2 is a sectional view taken along the line II—II in FIG. 1.

Figure 6:
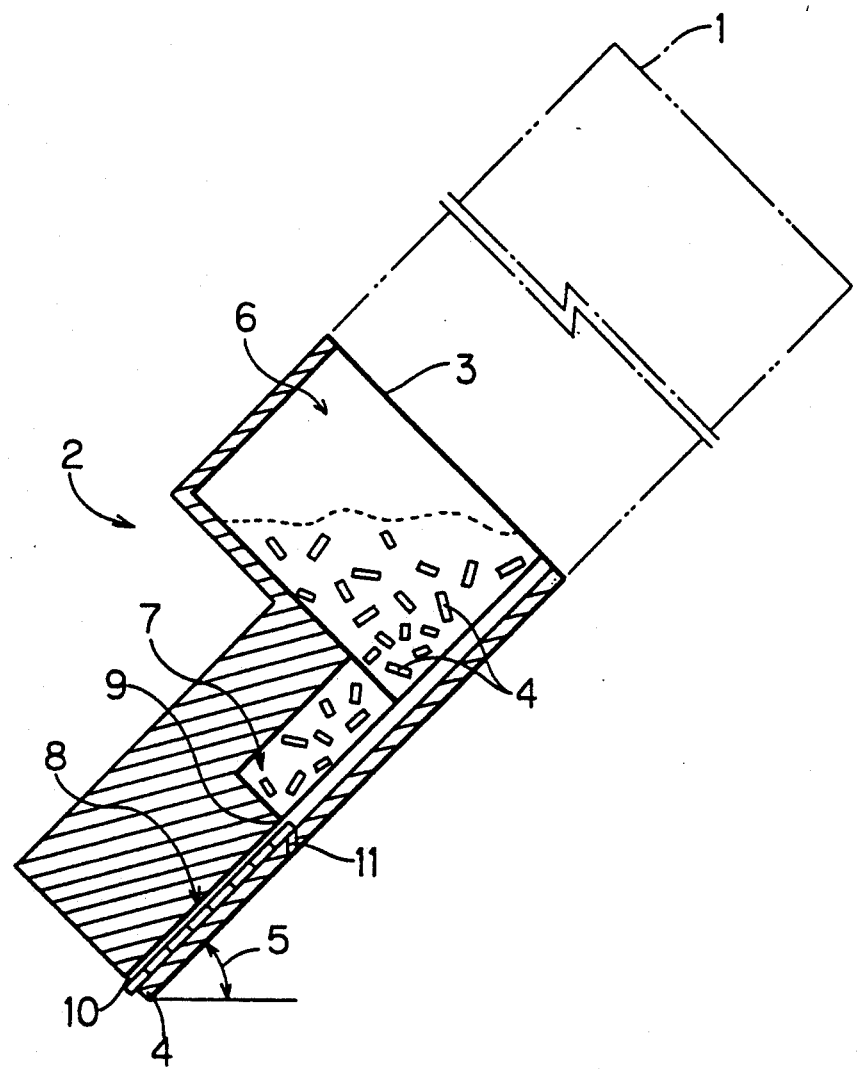
FIG. 6 is a longitudinal sectional view showing a conventional aligning apparatus 2 for electronic component chips, while in use.

As shown in FIG. 1, an opening 24 is provided on one end portion of the body 22. In order to introduce a plurality of electronic component chips (corresponding to the electronic component chips 4 shown in FIG. 6) into the opening 24, the cassette 1 storing electronic component chips, which is shown in FIG. 6, is mounted onto the opening 24. The electronic component chips are thus supplied into the aligning apparatus 21 and successively pass through a larger chamber 25 and a smaller chamber 26, to finally reach an aligning passage 27.

Similarly to the aligning passage 8 shown in FIG. 6, the aligning passage 27 is adapted to guide the plurality of electronic component chips to move in a state aligned along a prescribed direction. Although the aligning passage 27 has a bent configuration in this embodiment, such a configuration is not an essential feature of the present invention and the aligning passage 27 may linearly extend similarly to the aligning passage 8 shown in FIG. 6.

A blowing passage 30 (shown in broken lines in FIG. 1), which has a similar function to the blowing passage 11 shown in FIG. 6, is preferably provided in the vicinity of the inlet 28 for the aligning passage 27.

In addition to the blowing passage 30, the smaller chamber 26 has other features which attain smooth movement of the electronic component chips.

First, a gate 32, which allows passage of the electronic component chips through a relatively small path 31, is provided in the vicinity of the boundary between the smaller chamber 26 and the larger chamber 25. The gate 32 is adapted to prevent the electronic component chips which are located in a relatively low portion, such as those positioned in the smaller chamber 26, for example, from jamming caused by gravity of each electronic component chip when the aligning apparatus 21 stores a large number of electronic component chips, thereby preventing inhibition of smooth movement of the electronic component chips. The gate 32 is also adapted to substantially constantly maintain gravity which is applied to the electronic component chips, particularly those positioned in the smaller chamber 26, with no regard to the quantity of the electronic component chips stored in the aligning apparatus 21. The path 31 provided in the gate 32 is preferably defined by a rounded inner peripheral surface.

Further, the inner peripheral surface of the smaller chamber 26 is defined by a rounded wall surface 33, as shown in FIG. 2.

In this embodiment, both the body 22 and the side plate 23 of the aligning apparatus 21 are made of a resin material. It is particularly important that the resin material herein employed has conductivity. Such conductivity is preferably not more than $10^{10}$ $\Omega$.cm in terms of surface electrical resistance, for example. In order to attain such conductivity, an ordinary resin material is filled with a conductive filler of carbon or a metal. In addition to such filling with the conductive filler, wall surfaces 34, 33 and 35 respectively defining the larger chamber 25, the smaller chamber 26 and the aligning passage 27 may be coated with an antistatic agent, since higher conductivity is required for such wall surfaces, in particular.

The aligning passage 27, which is exposed to pressure of compressed air introduced from the blowing passage 30, for example, tends to have bending deformation. Therefore, the resin material must have relatively high strength. For example, the Young's modulus of the resin material is preferably at least 250 kg/mm$^2$.

Further, the resin material preferably has a mold shrinkage rate of not more than 0.04%, and a linear expansion coefficient of not more than $4.0 \times 10^{-5}$° C.$^{-1}$.

In addition, the resin material must have wear resistance and slipperiness in excess of prescribed levels.

A resin material capable of satisfying the above requirements may be prepared from polyphenylene sulfide, polyacetal, a bulk molding compound of polyethylene terephthalate, liquid crystal polymer, or the like.

The body 22 and the side plate 23, which are thus made of the resin material respectively, are integrated with each other, as shown in FIG. 2. Such integration can be made by fitting such as thermal welding, ultrasonic welding, thermal caulking, snap fitting or the like. While the body and the side plate, which are made of a metal, of the conventional aligner are joined with each other by metal screws, those of this embodiment can be joined with no screws since the same are made of the resin material as described above, whereby the cost can be reduced also in this point. In this embodiment, however, the employment of metal screws is not forbidden, to integrate the body 22 and the side plate 23.

In the embodiment shown in FIG. 1, the side plate 23 may be transparent, so that it is possible to observe movement of the electronic component chips in the aligning apparatus 21. In this case, the resin material for the side plate 23 may contain no conductive filler, since transparency of the resin material is reduced if the resin material is filled with the conductive filler. Also in this case, however, it is preferable to coat at least a portion of the side plate 23, which is to be in contact with the electronic component chips, with an antistatic agent.

Figure 3:
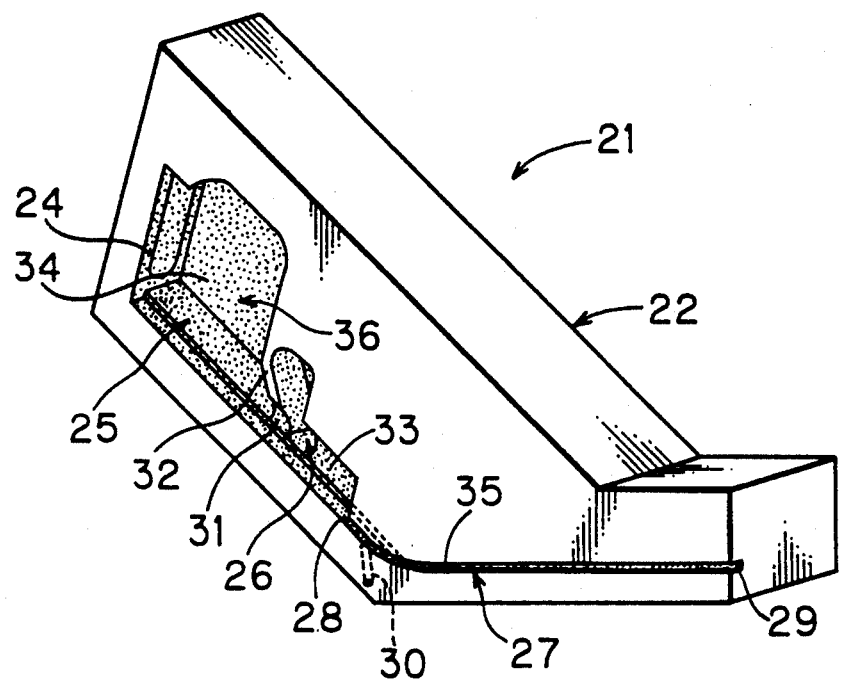
FIG. 3 is a perspective view showing a body 22 which is included in an aligning apparatus 21 according to another embodiment of the present invention.
Figure 4:
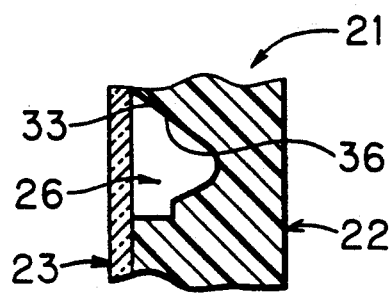
FIG. 4 is a sectional view illustrating the embodiment shown in FIG. 3 in correspondence to FIG. 2.

FIGS. 3 and 4 show another embodiment of the present invention. FIG. 3 is a perspective view which corresponds to FIG. 1, but illustrates no side plate 23. FIG. 4 is a sectional view corresponding to FIG. 2.

Referring to FIGS. 3 and 4, parts corresponding to those shown in FIGS. 1 and 2 are indicated by similar reference numerals, to omit redundant description.

In this embodiment, a body 22 of an aligning apparatus 21 for electronic component chips is made of an ordinary resin material, which is called engineering plastics. There is no need to fill this resin material with a conductive filler, and hence no conductivity is required for the resin material itself. Further, wear resistance and slipperiness are not strongly required for the resin material, as compared with the embodiment shown in FIGS. 1 and 2. This also applies to the side plate 23 (FIG. 1), which is not shown in FIG. 3.

In such a body 22, wall surfaces 34, 33 and 35 respectively defining a larger chamber 25, a smaller chamber 26 and an aligning passage 27 are covered with a metal-plated film 36. In FIG. 3 the speckled area indicates a region covered with the metal-plated film 36. Such a metal-plated film 36 is formed by nickel-phosphorus electroless plating, for example.

As shown in FIG. 4, the side plate 23 is covered with no such metal-plated film. However, the side plate 23 may also be covered with a metal-plated film, if necessary.

The metal-plated film 36, covering the wall surfaces 33, 34 and 35 as hereinabove described, may further cover other portions of the body 22.

Figure 5:
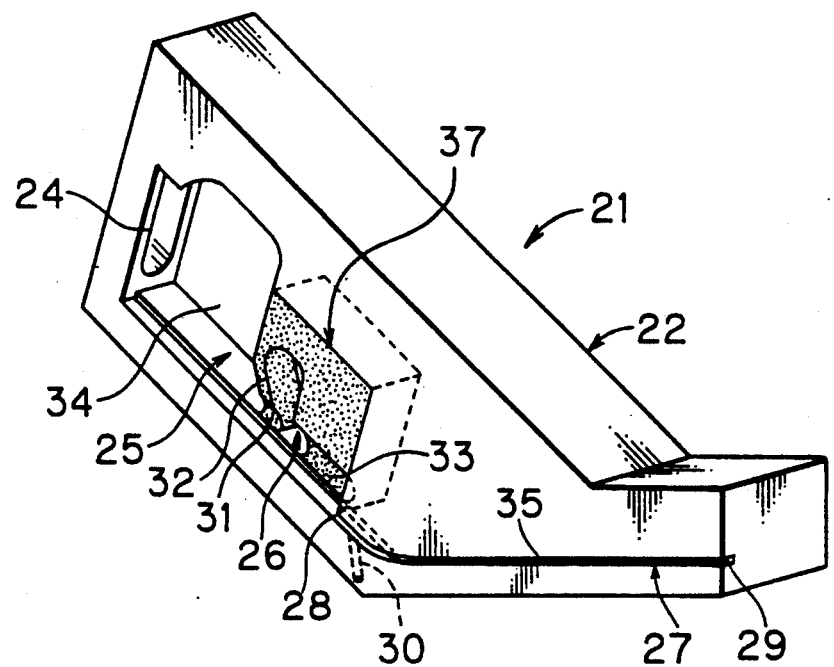
FIG. 5 is a perspective view showing a body 22 which is included in an aligning apparatus 21 according to still another embodiment of the present invention.

FIG. 5 shows still another embodiment of the present invention. This is a perspective view, which corresponds to FIG. 1 but illustrates no side plate 23.

Referring to FIG. 5, parts corresponding to those of FIG. 1 are indicated by similar reference numerals, to omit redundant description.

A body 22 of an aligning apparatus 21 for electronic component chips shown in FIG. 5 is different from the body 22 shown in FIG. 1 in that the body 22 comprises a metal block 37. The metal block 37 provides the most part of a wall surface 33 of a smaller chamber 26. When a resin material for forming other portions of the body 22 is molded, the metal block 37 is inserted in a metal mold for molding the resin material. The metal block 37 may be formed of any metal, such as stainless steel, aluminum or iron, for example.

The metal block 37 is effective not only in conductivity but in wear resistance, in particular. In other words, the metal block 37 is superior in reliability to the metal-plated film 36, as to wear resistance.

While the wall surface 33 of the smaller chamber 26, defining a portion close to an inlet for an aligning passage 27, is provided by the metal block 37 in the embodiment shown in FIG. 5, wall surfaces of other portions may also be provided by similar metal blocks at need.

In each of the embodiments as described above, the aligning passage 27 first communicates with the smaller chamber 26, which in turn communicates with the larger chamber 25. However, the internal space of the aligning apparatus 21 may not be divided into the smaller chamber 26 and the larger chamber 25, but rather a single chamber may directly communicate with the inlet for the aligning passage 27.

Although the present invention has been described and illustrated in detail, it is clearly understood that the same is by way of illustration and example only and is not to be taken by way of limitation, the scope of the present invention being limited only by the terms of the appended claims.

What is claimed is:

1. An apparatus for aligning electronic component chips, which is made substantially completely of a resin material, comprising:

a wall surface defining a chamber for storing a plurality of electronic component chips in random orientations; and a wall surface defining an aligning passage communicating with said chamber for guiding said electronic components, which were stored in said chamber, to move while aligned along a prescribed direction, after leaving said chamber;

at least said wall surface defining said chamber and said wall surface defining said aligning passage having means for providing said resin material wall surfaces with conductivity.

2. An apparatus for aligning electronic component chips, which is made substantially completely of a resin material, comprising:

a wall surface defining a chamber for storing a plurality of electronic component chips in random orientations; and a wall surface defining an aligning passage communicating with said chamber for guiding said electronic components, which were stored in said chamber, to move while aligned along a prescribed direction, after leaving said chamber;

at least said wall surface defining said chamber and said wall surface defining said aligning passage being provided with conductivity by a metal-plated film formed on the surface of said resin material.

3. An apparatus for aligning electronic component chips in accordance with claim 1, wherein said resin material is filled with a conductive filler, thereby providing said conductivity.

4. An apparatus for aligning electronic component chips in accordance with claim 3, wherein at least said wall surface defining said chamber and said wall surface defining said aligning passage are coated with an antistatic agent.

5. An apparatus for aligning electronic component chips in accordance with claim 1, wherein a wall surface of said chamber defining a portion close to an inlet for said aligning passage is provided by a metal block, and said resin material is molded around.

* * * * *